US008241839B2

United States Patent
Teng et al.

(10) Patent No.: US 8,241,839 B2
(45) Date of Patent: Aug. 14, 2012

(54) FABRICATION METHOD OF BRIGHTNESS ENHANCEMENT FILM

(75) Inventors: Tun-Chien Teng, Hsinchu (TW); Chih-Jen Tsang, Hsinchu (TW); Jyh-Ming Chen, Hsinchu (TW)

(73) Assignee: Coretronic Corporation, Hsin-Chu (TW)

( * ) Notice: Subject to any disclaimer, the term of this patent is extended or adjusted under 35 U.S.C. 154(b) by 375 days.

(21) Appl. No.: 12/662,020

(22) Filed: Mar. 29, 2010

(65) Prior Publication Data
US 2010/0255425 A1 Oct. 7, 2010

(30) Foreign Application Priority Data

Apr. 1, 2009 (TW) ............................... 98110891 A

(51) Int. Cl.
*G02B 3/06* (2006.01)
*G02B 5/04* (2006.01)

(52) U.S. Cl. .................. 430/321; 427/163.3; 427/164; 264/1.27

(58) Field of Classification Search .................. None
See application file for complete search history.

(56) References Cited

U.S. PATENT DOCUMENTS

| 2008/0130317 A1* | 6/2008 | Shimura et al. ............... 362/620 |
| 2009/0180191 A1* | 7/2009 | Yamada ........................ 359/625 |
| 2009/0274876 A1* | 11/2009 | Liou ............................ 428/167 |

FOREIGN PATENT DOCUMENTS

| JP | 2008-175968 A | * | 7/2008 |
| JP | 2010-054541 A | * | 3/2010 |
| TW | 507175 | | 10/2002 |

OTHER PUBLICATIONS

Computer-generated translation of JP 2010-054541 (Mar. 2010).*
Computer-generated transaltion of JP 2008-175968 (Jul. 2008).*

* cited by examiner

*Primary Examiner* — John A. McPherson
(74) *Attorney, Agent, or Firm* — Bacon & Thomas, PLLC

(57) ABSTRACT

A fabrication method of a brightness enhancement film (BEF) including the following steps is provided. A light transmissive substrate is provided and has a first surface and a second surface opposite to the first surface. Then, a plurality of first rod-shaped lenses are formed on the first surface. The rod-shaped lenses extend along a first direction and are arranged along a second direction. After that, a plurality of second stripe-shaped prisms are formed on the second surface. The stripe-shaped prisms extend along the second direction and are arranged along the first direction. Next, an electromagnetic wave beam is made to pass through the rod-shaped lenses, the light transmissive substrate and the stripe-shaped prisms in sequence. A first portion of each of the stripe-shaped prisms exposes and leaves a second portion of each of the stripe-shaped prisms unexposed. Then, the second portions of the stripe-shaped prisms are removed.

13 Claims, 4 Drawing Sheets

FABRICATION METHOD OF BRIGHTNESS ENHANCEMENT FILM

CROSS-REFERENCE TO RELATED APPLICATION

This application claims the priority benefit of Taiwan application serial No. 98110891, filed on Apr. 1, 2009. The entirety of the above-mentioned patent application is hereby incorporated by reference herein and made a part of this specification.

BACKGROUND OF THE INVENTION

1. Field of the Invention

The invention generally relates to a fabrication method of an optical film, and more particularly to a fabrication method of a brightness enhancement film.

2. Description of Related Art

A liquid crystal panel of a liquid crystal display (LCD) does not emit light itself, so the LCD employs a backlight module behind the liquid crystal panel to provide light source. The liquid crystal panel decides the illumination fluxes of different positions on the liquid crystal panel, so as to generate displaying image for the viewer.

The backlight module provides a uniformity planar source for the LCD to display a displaying image having a good display quality. In order to increase the light efficiency of the LCD, the light beam generated by the backlight module may have a small lighting angle, so that the light beam may be effectively emitted on the liquid crystal panel and be used by the liquid crystal panel.

A brightness enhancement film (BEF) may decrease the divergence angle of the light beam generated by the backlight module. However, a normal BEF may converge the light beam in one direction, so that the backlight module may employ two BEFs to converge the light beam in two directions, and thus increase the thickness and the cost of the LCD.

A BEF having optical micro-structures on both of the upper surface and lower surface may solve the problems described above. For the optical micro-structures of both upper surface and lower surface may decrease the divergence angle of the light beam in two directions, the LCD may have a good light efficiency by employing one BEF having micro-structures on both of the upper surface and the lower surface. A method of fabricating the BEF having micro-structures on both of the upper surface and the lower surface includes forming two resin layers on both upper surface and lower surface of a light transmissive substrate, and rolling the two resin layers respectively with two rollers having micro-structures of the surfaces, so as to forming a plurality of first micro-structures and a plurality of second micro-structures respectively on the two resin layers. However, since error may be occurred when the two rollers are positioned or rolled, the BEF formed by the method may have the problems of low optical quality or low yield rate.

SUMMARY OF THE INVENTION

Accordingly, the invention provides a fabrication method of a brightness enhancement film.

An embodiment of the invention provides a fabrication method of a brightness enhancement film including the following steps. First, a light transmissive substrate is provided. The light transmissive substrate has a first surface and a second surface opposite to the first surface. Then, a plurality of rod-shaped lenses are formed on the first surface. Each of the rod-shaped lenses extends along a first direction, the rod-shaped lenses are arranged along a second direction, and each of the rod-shaped lenses has a curved surface bent in the second direction. After that, a plurality of stripe-shaped prisms are formed on the second surface. Each of the stripe-shaped prisms extends along the second direction, and the stripe-shaped prisms are arranged along the first direction. Next, an electromagnetic wave beam is made to pass through the rod-shaped lenses, the light transmissive substrate and the stripe-shaped prisms in sequence. The rod-shaped lenses are capable of converging the electromagnetic wave beam, such that the electromagnetic wave beam passes through a first portion of each of the stripe-shaped prisms, the first portions of the stripe-shaped prisms are exposed, and a second portion of each of the stripe-shaped prisms is not exposed. Then, the second portions of the stripe-shaped prisms are removed.

In one embodiment of the invention, the method of forming the rod-shaped lenses includes the following steps. First, a resin layer on the first surface is coated. Then, a first roller is made to roll the resin layer. The first roller has a plurality of first stripe-shaped dents, and the shapes of the first stripe-shaped dents are corresponding to the shapes of the rod-shaped lenses. The first roller is capable of rolling the resin layer along the second direction, and the first stripe-shaped dents extend along the first direction. In the other hand, the first roller is capable of rolling the resin layer along the first direction, and the extending direction of the first stripe-shaped dents is substantially perpendicular to the second direction.

In one embodiment of the invention, the method of forming the stripe-shaped prisms includes the following steps. First, a photoresist layer is coated on the second surface. Then, a second roller is made to roll the photoresist layer. The second roller has a plurality of second stripe-shaped dents, and the shape of the second stripe-shaped dents are corresponding to the shapes of the stripe-shaped prisms. The second roller is capable of rolling the photoresist layer along the second direction, and the extending direction of the second stripe-shaped dents is substantially perpendicular to the first direction. In the other hand, the second roller is capable of rolling the photoresist layer along the first direction, and the second stripe-shaped dents extend along the second direction.

In one embodiment of the invention, the electromagnetic wave beam is a planar wave beam, and the planar wave beam is incident substantially perpendicular to the first surface. The method of removing the second portion of the stripe-shaped prisms includes solubilizing the second portion of the stripe-shaped prisms by a developer. After removing the second portion of the stripe-shaped prisms, the fabrication method of the BEF further includes solidifying the first portion of the stripe-shaped prisms. More particularly, the curved surface of each of the rod-shaped lenses is a convex surface. The first direction is substantially perpendicular to the second direction.

The fabrication method of the BEF of the embodiment of the invention uses the refraction of the electromagnetic wave beam in the rod-shaped lenses to selectively expose the stripe-shaped prisms to make the first portions of the stripe-shaped prisms align to the rod-shaped lenses. After removing the second portions unexposed, the BEF may have the rod-shaped lenses and the first portions of the stripe-shaped prisms with small positioning error, and the BEF may have a good optical quality, thus the yield rate may be increased.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
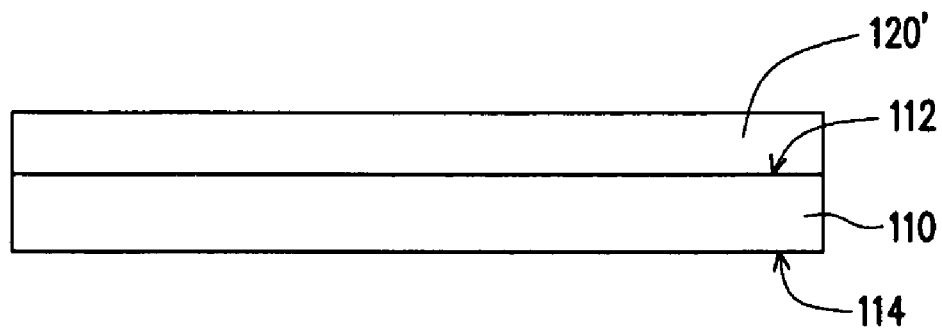
FIGS. 1A to 1H are flow diagrams of a fabrication method of a brightness enhancement film according to an embodiment of the invention.
Figure 1B:
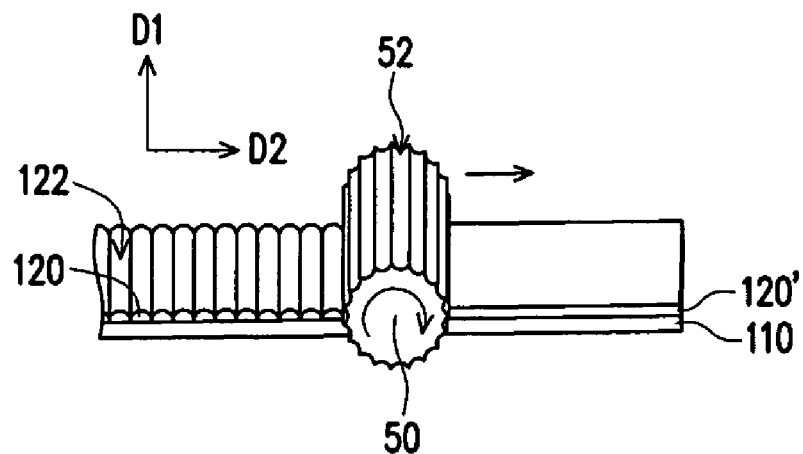
Figure 1C:
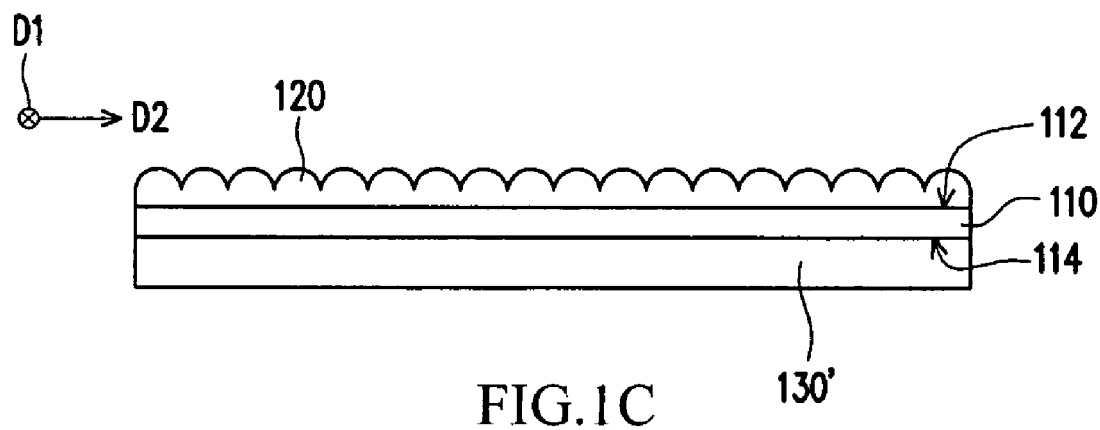

The fabrication method of a brightness enhancement film according to one embodiment of the invention includes the following steps. Referring to FIG. 1A, first, a light transmissive substrate 110 is provided. The light transmissive substrate has a first surface 112 and a second surface 114 opposite to the first surface 110. Then, referring to FIG. 1B, a plurality of rod-shaped lenses 120 are formed on the first surface 112. Each of the rod-shaped lenses 120 extends along a first direction D1, the rod-shaped lenses 120 are arranged along a second direction D2, and each of the rod-shaped lenses 120 has a curved surface 122 bent in the second direction D2. The curved surface 122 is, for example, a convex surface. In the embodiment of the invention, the method of forming the rod-shaped lenses 120 includes the following steps. Referring to FIG. 1A, first, a resin layer 120' is coated on the first surface. Then, referring to FIG. 1B, a first roller 50 is made to roll the first layer 120', wherein the first roller 50 has a plurality of first stripe-shaped dents 52, and the shapes of the first strip-shaped dents 52 are corresponding to the shapes of the rod-shaped lenses 120. After the first roller 52 rolls the resin layer 120', the shapes of the rod-shaped lenses 120 roll out. Specifically, the roller 50 rolls the resin layer 120' along the second direction D2, and the first stripe-shaped dents 52 extend along the first direction D1. In the embodiment, the method of forming the rod-shaped lenses 120 further includes making the resin layer 120' rolled by the first roller solidified to make the shapes of the rod-shaped lenses 120 maintain. The solidifying method is, for example, photo-curing or thermal curing. In another embodiment of the invention, the method of forming the rod-shaped lenses 120 is using a pattern plate having the stripe-shaped dents 52 impressing the resin layer 120' to form the rod-shaped lenses 120, or using injection moulding to form the rod-shaped lenses 120.

Figure 1D:
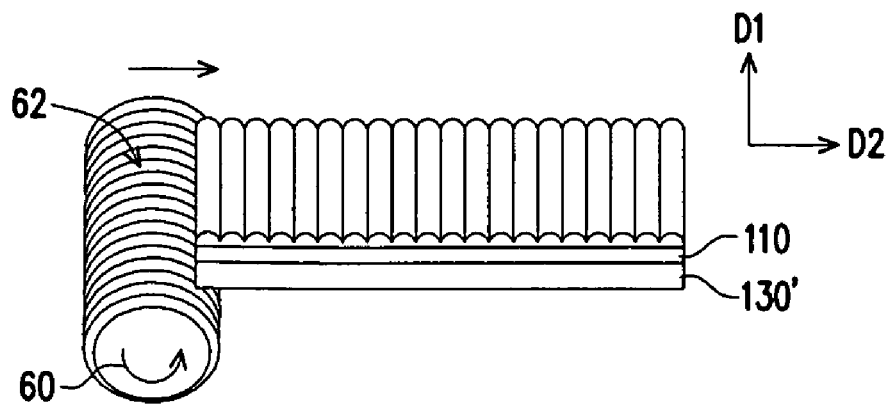
Figure 1E:
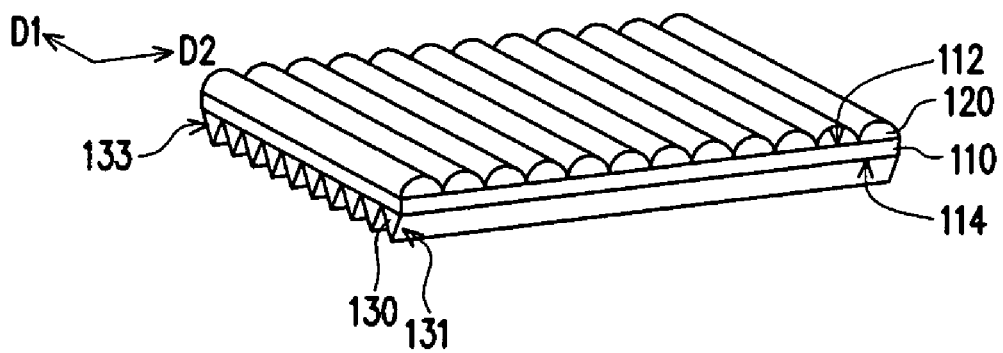

Referring to FIG. 1E, a plurality of stripe-shaped prisms 130 are formed on the second surface 114, wherein each of the stripe-shaped prisms 130 extends along the second direction D2, and the stripe-shaped prisms 130 are arranged along the first direction D1. In the embodiment of the invention, each of the stripe-shaped prisms 130 has a first stripe prism surface 131 and a second stripe prism surface 133 connected to the first stripe prism surface 131 (positing at the back of the first stripe prism surface 131 in FIG. 1E). The first stripe prism surface 131 and the second stripe prism surface 133 extend along the second direction. In the embodiment of the invention, the tilt angle between the first stripe prism surface 131 and the second surface 114 is not equal to the tilt angle between the second stripe prism surface 133 and the second surface 114. In another embodiment of the invention, the tilt angle between the first stripe prism surface 131 and the second surface 114 is substantially equal to the tilt angle between the second stripe prism surface 133 and the second surface 114.

In the embodiment of the invention, the method of forming the stripe-shaped prisms 130 includes the following steps. Referring to FIG. 1, first, a photoresist layer 130' is formed on the second surface 114. Then, referring to FIGS. 1D and 1E, a second roller 60 is made to roll the photoresist layer 130', wherein the second roller 60 has a plurality of second stripe-shaped dents 62, and the shapes of the second stripe-shaped dents are corresponding to the shapes of the stripe-shaped prisms 130. After the second roller 60 rolls the photoresist layer 130', the shapes of the stripe-shaped prisms 130 roll out. Specifically, the second roller 60 rolls the photoresist layer 130' along the second direction D2, and the extending direction of the second stripe-shaped dents 62 is substantially perpendicular to the first direction D1. In another embodiment of the invention, the method of forming the stripe-shaped prisms 130 is using a pattern plate having the stripe-shaped dents corresponding to the stripe-shaped prisms 130 impressing the photoresist layer 130' to form the stripe-shaped prisms 130, or using injection moulding to form the stripe-shaped prisms 130.

Figure 1F:
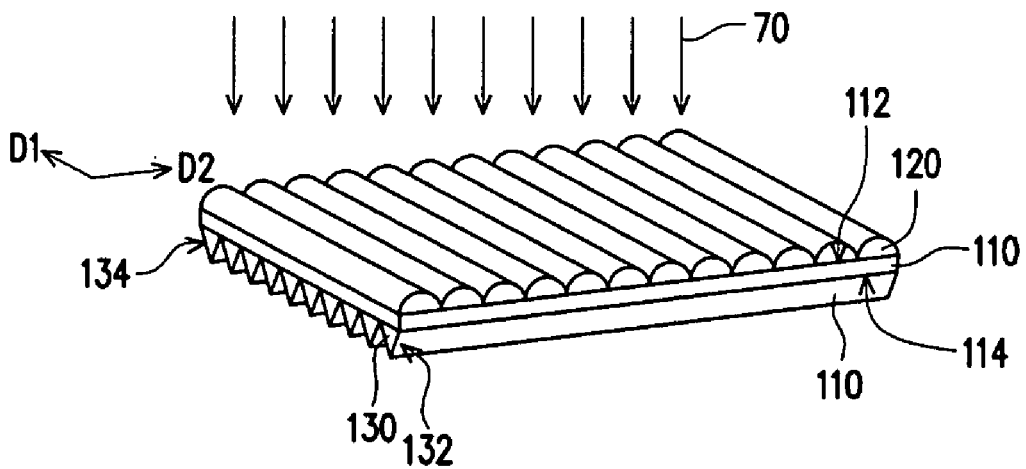
Figure 1G:
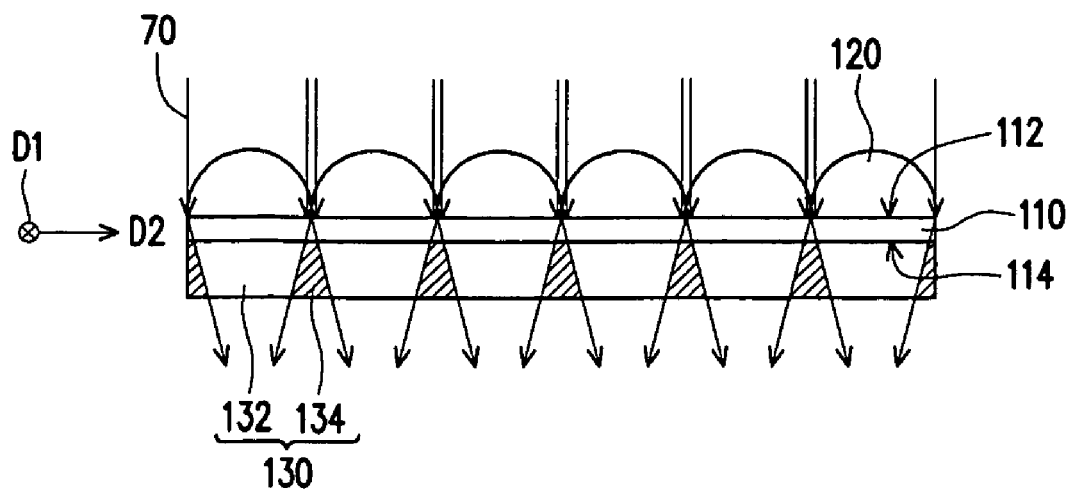

Referring to FIGS. 1F and 1G, an electromagnetic wave beam 70 is made to pass through the rod-shaped lenses 120, the substrate 110 and the stripe-shaped prisms 130 in sequence. In the embodiment of the invention, the electromagnetic wave beam 70 is, for example, a visible light beam or an ultraviolet light beam, and wave length of the electromagnetic wave beam 70 is chosen corresponding to the material of the photoresist layer 130 (as shown in FIG. 1D). Besides, in the embodiment of the invention, the electromagnetic wave beam 70 is, for example, a planar wave beam, and the planar wave beam is perpendicularly incident into the first surface 112.

The rod-shaped lenses 120 are capable of converging the electromagnetic wave beam 70 to make the electromagnetic wave beam 70 pass through a first portion 132 of each of the stripe-shaped prisms 130, and the first portions 132 of the stripe-shaped prisms are exposed. Specifically, the electromagnetic wave beam 70 is converged along the second direction D2, and the width along the second direction D2 of the electromagnetic wave beam 70 is gradually decreased as leaving the substrate 110. A second portion 134 (the portion is not passed through by the converged electromagnetic wave beam 70) of the rest of each of the stripe-shaped prisms 130 is not exposed.

Figure 1H:
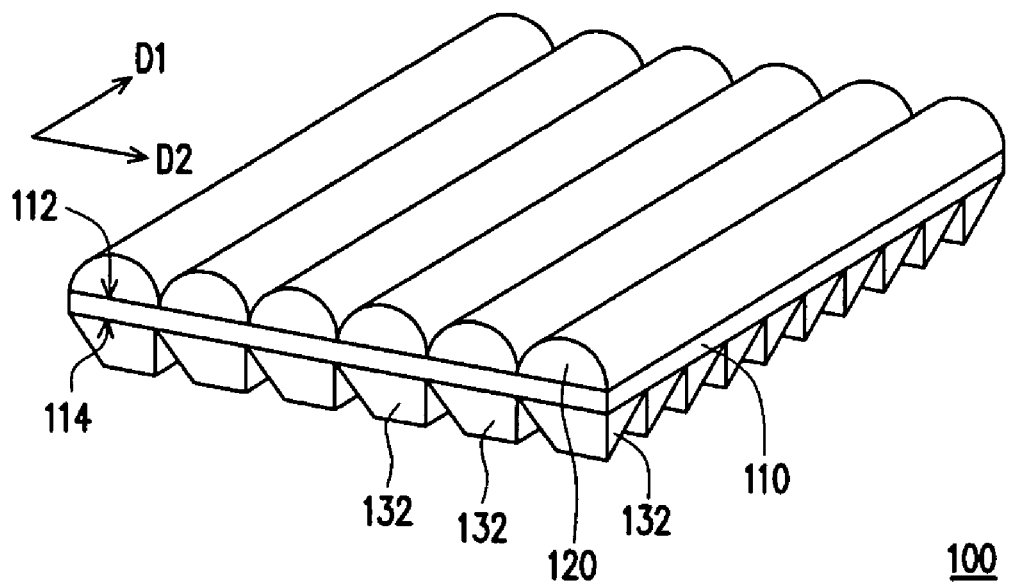

Referring to FIGS. 1G and 1H, the second portions 134 of the stripe-shaped prisms 130 is removed. In the embodiment of the invention, the method of removing the second portions 134 of the stripe-shaped prisms 130 includes solubilizing the second portions 134 with developer. Besides, in the embodiment of the invention, after removing the second portion 134, further includes solidifying the first portions 132 of the stripe-shaped prisms 130, and the solidifying method is, for example, photo-curing or thermal curing. The first portions 132 of the stripe-shaped prisms 130 forms the micro-structure on the second surface 114, and the brightness enhancement film (BEF) 100 of the embodiment of the invention is fabricated. The first portions 132 may converge the light incident into the second surface 114 along the first direction D1, and the rod-shaped lenses 120 may converge the light incident into the second surface 114 along the second direction D2. So the LCD employs one BEF 100 may converge the light along two directions perpendicular to each other, and thus achieve the function of low cost and thickness.

The fabrication method of the BEF according to the embodiment of the invention uses the refraction of the electromagnetic wave beam 70 in the rod-shaped lenses 120 to selectively expose the stripe-shaped prisms 130 to make the first portions 132 of the stripe-shaped prisms 130 align to the rod-shaped lenses 120. After removing the second portions 134 unexposed, the BEF 100 may have the rod-shaped lenses 120 and the first portions of the stripe-shaped prisms 130 with small positioning error, and the BEF 100 may have a good optical quality, thus the yield rate may be increased.

Figure 2:
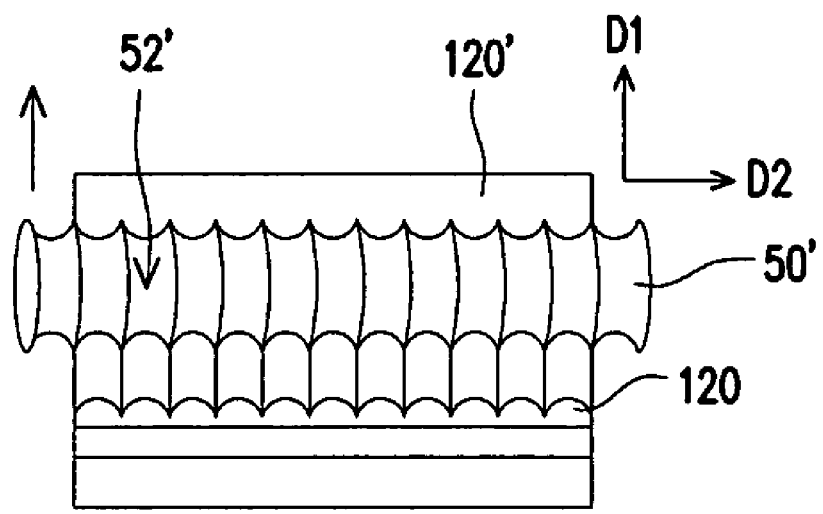
FIG. 2 shows a change of the fabrication method in FIG. 1B.

Referring to FIG. 2, in the embodiment of the invention, the first roller 50' rolls the resin layer 130' along the first direction D1, the extending direction of the plurality of the first stripe-shaped dents 52' of the first roller 50' is substantially perpendicular to the second direction D2, and the shapes of the first stripe-shaped dents 52' are corresponding to the shapes of the shapes of the rod-shaped lenses 120.

Figure 3:
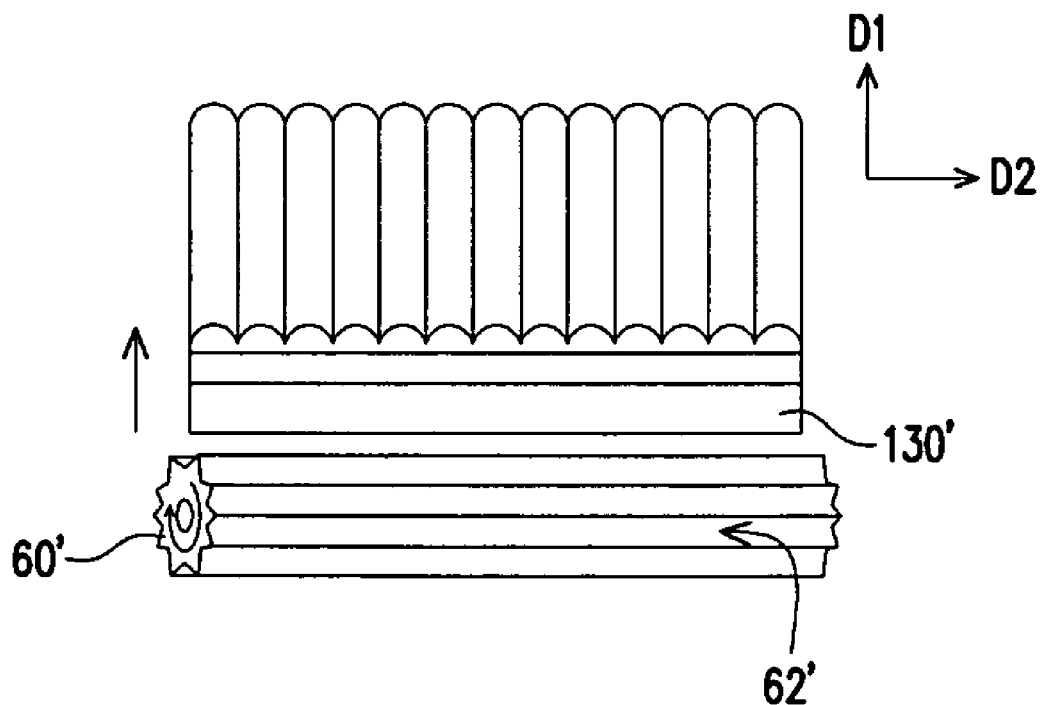
FIG. 3 shows a change of the fabrication method in FIG. 1D.

Referring to FIG. 3, in the embodiment of the invention, the second roller 60' rolls the photoresist layer 130' along the first direction D1, the second stripe-shaped dents 62' of the second roller 60' extend along the second direction D2, and the shapes of the second stripe-shaped dents are corresponding to the shapes of the stripe-shaped prisms 130 (as shown in FIG. 1E).

In conclusion, the fabrication method of the BEF according to the embodiment of the invention uses the refraction of the electromagnetic wave beam in the rod-shaped lenses to selectively expose the stripe-shaped prisms to make the first portions of the stripe-shaped prisms align to the rod-shaped lenses. After removing the second portions unexposed, the BEF may have the rod-shaped lenses and the first portions of the stripe-shaped prisms with small positioning error, and the BEF may have a good optical quality, thus the yield rate may be increased.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A fabrication method of a brightness enhancement film, comprising:
   providing a light transmissive substrate, wherein the light transmissive substrate has a first surface and a second surface opposite to the first surface;
   forming a plurality of rod-shaped lenses on the first surface, wherein each of the rod-shaped lenses extends along a first direction, the rod-shaped lenses are arranged along a second direction, and each of the rod-shaped lenses has a curved surface bent in the second direction;
   forming a plurality of stripe-shaped prisms on the second surface, wherein each of the stripe-shaped prisms extends along the second direction and the striped-shaped prisms are arranged along the first direction;
   making an electromagnetic wave beam pass through the rod-shaped lenses, the light transmissive substrate, and the stripe-shaped prisms in sequence, wherein the rod-shaped lenses are capable of converging the electromagnetic wave beam, such that the electromagnetic wave beam is capable of passing through a first portion of each of the stripe-shaped prisms, the first portions of the stripe-shaped prisms are exposed, and a second portion of each of the stripe-shaped prisms is not exposed; and removing the second portions of the striped-shaped prisms.

2. The fabrication method of the brightness enhancement film of claim 1, wherein the method of forming the rod-shaped lenses comprises:

coating a resin layer on the first surface; and making a first roller roll the resin layer, wherein the first roller comprises a plurality of first stripe-shaped dents, and the shapes of the first stripe-shaped dents are corresponding to the shapes of the rod-shaped lenses.

3. The fabrication method of the brightness enhancement film of claim 2, wherein the first roller is capable of rolling the resin layer along the second direction, and the first stripe-shaped dents extend along the first direction.

4. The fabrication method of the brightness enhancement film of claim 2, wherein the first roller is capable of rolling the resin layer along the first direction, and the extending direction of the first stripe-shaped dents is substantially perpendicular to the second direction.

5. The fabrication method of the brightness enhancement film of claim 2, wherein the method of forming the rod-shaped lenses further comprises solidifying the resin layer rolled by the first roller.

6. The fabrication method of the brightness enhancement film of claim 1, wherein the method of forming the stripe-shaped prisms comprises:

coating a photoresist layer on the second surface; and making a second roller roll the photoresist layer, wherein the second roller comprises a plurality of second stripe-shaped dents, and the shapes of the second stripe-shaped dents are corresponding to the shapes of the striped-shaped prisms.

7. The fabrication method of the brightness enhancement film of claim 6, wherein the second roller is capable of rolling the photoresist layer along the second direction, and the extending direction of the second stripe-shaped dents is substantially perpendicular to the first direction.

8. The fabrication method of the brightness enhancement film of claim 6, wherein the second roller is capable of rolling the photoresist layer along the first direction, and the second stripe-shaped dents extend along the second direction.

9. The fabrication method of the brightness enhancement film of claim 1, wherein the electromagnetic wave beam is a planar wave beam, and the planar wave beam is incident substantially perpendicular to the first surface.

10. The fabrication method of the brightness enhancement film of claim 1, wherein the method of removing the second portions of the stripe-shaped prisms comprises solubilizing the second portions of the stripe-shaped prisms by a developer.

11. The fabrication method of the brightness enhancement film of claim 1, further comprising solidifying the first portions of the stripe-shaped prisms after removing the second portions of the striped-shaped prisms.

12. The fabrication method of the brightness enhancement film of claim 1, wherein the curved surface of each of the rod-shaped lenses is a convex surface.

13. The fabrication method of the brightness enhancement film of claim 1, wherein the first direction is substantially perpendicular to the second direction.

* * * * *